United States Patent
An et al.

(10) Patent No.: US 11,455,943 B2
(45) Date of Patent: Sep. 27, 2022

(54) SEMICONDUCTOR DEVICE HAVING SEPARATE INITIALIZATION VOLTAGE LINES

(71) Applicant: SAMSUNG DISPLAY CO., LTD., Yongin-si (KR)

(72) Inventors: Jin Sung An, Seongnam-si (KR); Seok Je Seong, Seongnam-si (KR); Ji Seon Lee, Hwaseong-si (KR); Se Wan Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/187,996

(22) Filed: Mar. 1, 2021

(65) Prior Publication Data

US 2021/0280127 A1    Sep. 9, 2021

(30) Foreign Application Priority Data

Mar. 4, 2020    (KR) .................. 10-2020-0027043

(51) Int. Cl.
*G09G 3/32* (2016.01)
*H01L 33/16* (2010.01)
*H01L 33/62* (2010.01)

(52) U.S. Cl.
CPC .............. *G09G 3/32* (2013.01); *H01L 33/16* (2013.01); *H01L 33/62* (2013.01);
(Continued)

(58) Field of Classification Search
CPC ......... G09G 3/32; G09G 3/3225–3291; G09G 2300/0426; G09G 2300/043;
(Continued)

(56) References Cited

U.S. PATENT DOCUMENTS

| 8,711,138 B2 | 4/2014 | Kawabe |
| 2013/0120338 A1* | 5/2013 | Kubota ................ G09G 3/3208 345/211 |

(Continued)

FOREIGN PATENT DOCUMENTS

| KR | 10-2018-0004382 | 1/2018 |
| KR | 10-2018-0112158 | 10/2018 |
| KR | 10-2019-0055301 | 5/2019 |

*Primary Examiner* — Nathan Danielsen
(74) *Attorney, Agent, or Firm* — F. Chau & Associates, LLC

(57) ABSTRACT

A display device includes a substrate, a polycrystalline semiconductor layer including a channel of a driving transistor, and a channel of a seventh transistor, a gate electrode of the driving transistor overlapping the channel thereof, a gate electrode of the seventh transistor overlapping the channel thereof, an oxide semiconductor layer including a channel of a fourth transistor, a gate electrode thereof overlapping the channel of the fourth transistor, a first initialization voltage line connected to a first electrode of the fourth transistor, the first initialization voltage line and the gate electrode of the fourth transistor being position on a same layer, and a second initialization voltage line connected to a second electrode of the seventh transistor, the second initialization voltage line and the first initialization voltage line being positioned on different layers from each other.

19 Claims, 10 Drawing Sheets

(52) U.S. Cl.
CPC .............. *G09G 2300/0426* (2013.01); *G09G 2310/0267* (2013.01); *G09G 2310/0275* (2013.01)

(58) Field of Classification Search
CPC ....... G09G 2300/08; G09G 2300/0809; G09G 2300/0819; G09G 2300/0876; G09G 2310/0243–0251; G09G 2310/0267; G09G 2310/0275; G09G 2310/06–062; G09G 2320/02; G09G 2320/0252; G09G 2330/04; H01L 33/16; H01L 33/62
See application file for complete search history.

(56) References Cited

U.S. PATENT DOCUMENTS

| | | | | |
|---|---|---|---|---|
| 2014/0320544 | A1* | 10/2014 | Kim | H01L 27/3262 345/690 |
| 2016/0379552 | A1* | 12/2016 | Kim | G09G 3/3233 345/76 |
| 2017/0365214 | A1* | 12/2017 | Tsai | G09G 3/3233 |
| 2018/0006105 | A1* | 1/2018 | Kim | G09G 3/3266 |
| 2018/0174525 | A1* | 6/2018 | Kim | G09G 3/3283 |
| 2019/0035875 | A1* | 1/2019 | Xin | G09G 3/3233 |
| 2019/0147799 | A1* | 5/2019 | Kim | G09G 3/3291 345/55 |
| 2020/0066212 | A1* | 2/2020 | Kim | G09G 3/3233 |

\* cited by examiner

SEMICONDUCTOR DEVICE HAVING SEPARATE INITIALIZATION VOLTAGE LINES

CROSS-REFERENCE TO RELATED APPLICATION

This application claims priority to and the benefit of Korean Patent Application No. 10-2020-0027043 filed in the Korean Intellectual Property Office on Mar. 4, 2020, the entire contents of which are herein incorporated by reference.

BACKGROUND

1. Field

The present disclosure relates to a display device, more particularly to a display device having a transistor with a polycrystalline silicon semiconductor and a transistor with an oxide semiconductor.

2. Description of the Related Art

An organic light emitting device includes two electrodes and an organic emission layer disposed therebetween, and electrons injected from one electrode are combined with holes injected from the other electrode in the organic emission layer to form excitons. The excitons transit to a ground state from an excited state to output energy and emit light.

The organic light emitting device includes a plurality of pixels including an organic light emitting diode that is a self-light-emitting device, and a plurality of transistors and at least one capacitor for driving the organic light emitting diode are formed on respective pixels. The plurality of transistors include a switching transistor and a driving transistor.

A number of pixels may be increased so as to increase a resolution of the organic light emitting device, an aperture ratio may be reduced in a high-speed driving process so as to realize stable video, a current density may be increased, and a driving voltage may increase. Accordingly, stains are generated, and reliability of elements such as transistors is deteriorated.

The above information disclosed in this Background section is only for enhancement of understanding of the background of the technology and therefore it may contain information that does not form the prior art that is already known in this country to a person of ordinary skill in the art.

SUMMARY

The described technology has been made in an effort to drive a display device in a stable way, improve reliability, and reduce power consumption.

According to an exemplary embodiment of the present invention, a display device includes a substrate, a polycrystalline semiconductor layer on the substrate, the polycrystalline semiconductor layer including a channel, a first electrode, and a second electrode of a driving transistor, and a channel, a first electrode, and a second electrode of a seventh transistor, a gate electrode of the driving transistor overlapping the channel of the driving transistor, a gate electrode of the seventh transistor overlapping the channel of the seventh transistor, an oxide semiconductor layer on the substrate, the oxide semiconductor layer including a channel, a first electrode, and a second electrode of a fourth transistor, a gate electrode of the fourth transistor overlapping the channel of the fourth transistor, a first initialization voltage line connected to the first electrode of the fourth transistor, the first initialization voltage line and the gate electrode of the fourth transistor being position on a same layer, and a second initialization voltage line connected to the second electrode of the seventh transistor, the second initialization voltage line and the first initialization voltage line being positioned on different layers from each other.

The first initialization voltage line overlaps the second initialization voltage line. The display device further includes a scan line overlapping the first initialization voltage line and the second initialization voltage line, a data line overlapping the first initialization voltage line and the second initialization voltage line, and a second transistor connected to the scan line and the data line.

The display device further includes a connection electrode for connecting the first initialization voltage line and the first electrode of the fourth transistor.

The display device further includes an insulating layer positioned between the first initialization voltage line and the connection electrode and between the first electrode of the fourth transistor and the connection electrode, the insulating layer including a first opening exposing the first initialization voltage line and a second opening exposing the first electrode of the fourth transistor, the connection electrode being connected to the first initialization voltage line through the first opening, and the connection electrode being connected to the first electrode of the fourth transistor through the second opening.

The connection electrode and the data line are disposed on a same layer, and the connection electrode overlaps the first initialization voltage line and the first electrode of fourth transistor.

The display device further includes a connection electrode for connecting the second initialization voltage line and the second electrode of the seventh transistor.

The display device further includes an insulating layer positioned between the second initialization voltage line and the connection electrode and between the second electrode of the seventh transistor and the connection electrode, the insulating layer including a first opening exposing the second initialization voltage line and a second opening exposing the second electrode of the seventh transistor, the connection electrode being connected to the second initialization voltage line through the first opening, and the connection electrode being connected to the second electrode of the seventh transistor through the second opening.

The connection electrode and the data line are disposed on a same layer, and the connection electrode overlaps the second initialization voltage line and the second electrode of the seventh transistor.

A first initialization voltage is applied via the first initialization voltage line to the first electrode of the fourth transistor, a second initialization voltage is applied via the second initialization voltage line to the second electrode of the seventh transistor, and the first initialization voltage may be different from the second initialization voltage.

The display device further includes a first storage electrode overlapping the gate electrode of the driving transistor, the second initialization voltage line and the first storage electrode being on a same layer, the oxide semiconductor layer further including a channel, a first electrode, and a second electrode of a third transistor, and the channel of the third transistor and the channel of the fourth transistor being positioned on a same layer.

The display device further includes a light blocking layer of the fourth transistor overlapping the channel of the fourth transistor, the light blocking layer of the fourth transistor and the first storage electrode being on a same layer.

The display device further includes a gate electrode of the third transistor overlapping the channel of the third transistor, a light blocking layer of the third transistor overlapping the channel of the third transistor, the light blocking layer of the third transistor and the first storage electrode being on a same layer, and a connection electrode connecting the second electrode of the driving transistor and the first electrode of the third transistor.

The display device include a plurality of pixels, each of the plurality of pixels including the driving transistor, the fourth transistor, and the seventh transistor, and the plurality of pixels having the same shape as each other.

According to an exemplary embodiment of the present invention, a display device includes a light emitting diode (LED) connected between a driving voltage line for applying a driving voltage to an anode of the light emitting diode and a common voltage line for applying a common voltage to a cathode of the light emitting diode, a driving transistor connected between the driving voltage line and the anode of the light emitting diode (LED) and configured to supply a driving current to the light emitting diode, a second transistor connected between a first electrode of the driving transistor connected to the driving voltage line and a data line to which a data voltage is applied, a third transistor connected between a second electrode of the driving transistor connected to the light emitting diode (LED) and a gate electrode of the driving transistor, a fourth transistor connected between the gate electrode of the driving transistor and a first initialization voltage line to which a first initialization voltage is applied; a seventh transistor connected between the anode of the light emitting diode (LED) and a second initialization voltage line to which a second initialization voltage is applied, and a storage capacitor connected between the driving voltage line and the gate electrode of the driving transistor. The driving transistor and the second transistor include polycrystalline semiconductor layer, and the third transistor and the fourth transistor may include an oxide semiconductor layer.

The first initialization voltage line overlaps the second initialization voltage line.

The display device further includes a scan line connected to the second transistor and receiving a scan signal. The scan line overlaps the first initialization voltage line and the second initialization voltage line.

The display device further includes a first connection electrode connecting the first initialization voltage line and the fourth transistor; and a second connection electrode connecting the second initialization voltage line and the seventh transistor.

The driving transistor, the second transistor, and the seventh transistor are p-type transistors, and the third transistor and the fourth transistor are n-type transistors.

The display device further includes a fifth transistor connected between the driving voltage line and the first electrode of driving transistor, and a sixth transistor connected between the first electrode of the driving transistor and the light emitting diode (LED).

According to the exemplary embodiments, the display device may be stably driven, reliability may be improved, and power consumption may be reduced.

DETAILED DESCRIPTION OF EXEMPLARY EMBODIMENTS

Figure 1:
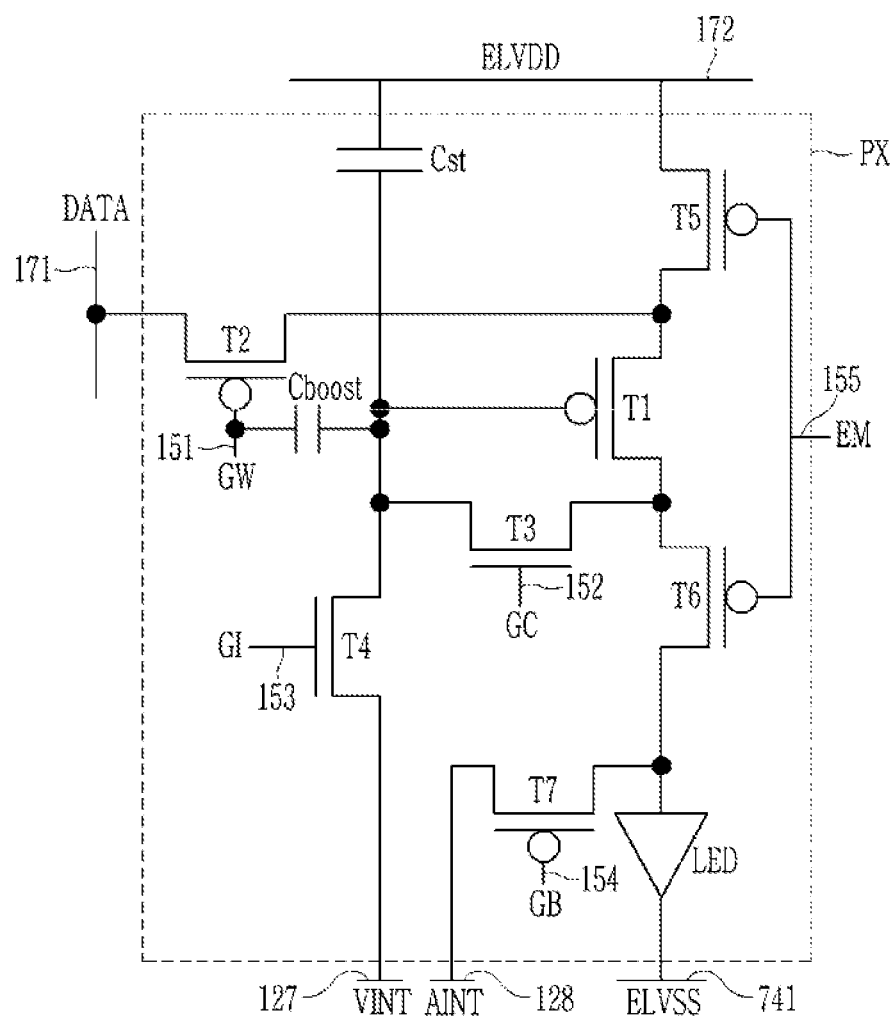
FIG. 1 shows a circuit diagram of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

The size and thickness of each configuration shown in the drawings are arbitrarily shown for better understanding and ease of description, and the present invention is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction. Unless explicitly described to the contrary, the word "comprise" and variations such as "comprises" or "comprising" will be understood to imply the inclusion of stated elements but not the exclusion of any other elements.

The phrase "in a plan view" means viewing the object portion from the top, and the phrase "in a cross-sectional view" means viewing a cross-section of which the object portion is vertically cut from the side A pixel of a display device according to an exemplary embodiment will now be described with reference to FIG. 1

FIG. 1 shows a circuit diagram of a display device according to an exemplary embodiment. One pixel PX of the display device according to an exemplary embodiment includes a plurality of transistors T1, T2, T3, T4, T5, T6, and T7 connected to various signal lines 127, 128, 151, 152, 153, 154, 155, 171, 172, and 741, a storage capacitor Cst, a boost capacitor (Cboost), and a light emitting diode (LED).

The display device includes a display area for displaying images, and the pixel PX is arranged in the display area in various forms.

A plurality of signal lines 127, 128, 151, 152, 153, 154, 155, 171, 172, and 741 are connected to one pixel PX. A plurality of signal lines include a first initialization voltage line 127, a second initialization voltage line 128, a scan line 151, an inverted scan line 152, an initialization control line 153, a bypass control line 154, an emission control line 155, a data line 171, a driving voltage line 172, and a common voltage line 741.

The scan line 151 is connected to a gate driver (not shown) and transmits a scan signal (GW) to the second transistor T2. The inverted scan line 152 may receive a voltage with opposite polarity to a voltage applied to the scan line 151 at the same time as the signal of the scan line 151. For example, when a high voltage is applied to the scan line 151, a low voltage may be applied to the inverted scan line 152. The inverted scan line 152 transmits an inverted scan signal (GC) to the third transistor T3.

The initialization control line 153 transmits an initialization control signal (GI) to the fourth transistor T4 (i.e., a first initialization transistor). The bypass control line 154 transmits a bypass signal (GB) to the seventh transistor T7 (i.e., a second initialization transistor). The bypass control line 154 may be made of the scan line 151 at a rear end. The emission control line 155 transmits an emission control signal (EM) to the fifth transistor T5 and the sixth transistor T6.

The data line 171 is a wire for transmitting a data voltage (DATA) generated by a data driver (not shown), and luminance of light emitted by the light emitting diode (LED) changes according to the data voltage (DATA) applied to the pixel PX.

The driving voltage line 172 applies a driving voltage (ELVDD). For example, the driving voltage (ELVDD) is supplied to the pixel PX via the driving voltage line 172. The first initialization voltage line 127 transmits a first initialization voltage (VINT), and the second initialization voltage line 128 transmits a second initialization voltage (AINT). The common voltage line 741 applies a common voltage (ELVSS) to a cathode of the light emitting diode (LED). In the present exemplary embodiment, voltages applied to the driving voltage line 172, the first and second initialization voltage lines 127 and 128, and the common voltage line 741 may be a constant voltage.

A configuration and a connection relationship of a plurality of transistors will now be described in detail.

The driving transistor T1 (i.e., a first transistor) may be a p-type transistor, and may include a polycrystalline semiconductor (i.e., a polycrystalline semiconductor layer). The driving transistor T1 controls a size of a current output to an anode of the light emitting diode (LED) according to the data voltage (DATA) applied to a gate electrode of the driving transistor T1. Brightness of the light emitting diode (LED) is controlled by the size of a driving current output to the anode of the light emitting diode (LED), so luminance of the light emitting diode (LED) may be controlled according to the data voltage (DATA) applied to the pixel PX. For this purpose, a first electrode of the driving transistor T1 receives the driving voltage (ELVDD), and is connected to the driving voltage line 172 through the fifth transistor T5. The first electrode of the driving transistor T1 is connected to a second electrode of the second transistor T2 to receive the data voltage (DATA). The second electrode of the driving transistor T1 outputs a current to the light emitting diode (LED), and is connected to the anode of the light emitting diode (LED) through the sixth transistor T6. The second electrode of the driving transistor T1 transmits the data voltage (DATA) applied to the first electrode to the third transistor T3. A gate electrode of the driving transistor T1 is connected to one electrode (hereinafter, a second storage electrode) of the storage capacitor Cst. A voltage at the gate electrode of the driving transistor T1 changes according to the voltage stored in the storage capacitor Cst, and the driving current output by the driving transistor T1 accordingly changes. The storage capacitor Cst also maintains the voltage at the gate electrode of the driving transistor T1 for one frame.

The second transistor T2 may have a p-type transistor, and may include a polycrystalline semiconductor. The second transistor T2 receives the data voltage (DATA) to be supplied to the pixel PX. A gate electrode of the second transistor T2 is connected to the scan line 151 and the first electrode of the boost capacitor (Cboost). A first electrode of the second transistor T2 is connected to the data line 171. A second electrode of the second transistor T2 is connected to the first electrode of the driving transistor T1. When the second transistor T2 is turned on by a low voltage from among the scan signals (GW) transmitted through the scan line 151, the data voltage (DATA) transmitted through the data line 171 is transmitted to the first electrode of the driving transistor T1.

The third transistor T3 (i.e., an oxide semiconductor transistor) may be an n-type transistor, and may include an oxide semiconductor (i.e., an oxide semiconductor layer). The third transistor T3 electrically connects the second electrode of the driving transistor T1 and the gate electrode of the driving transistor T1. As a result, the third transistor T3 transmits a compensation voltage that is changed when the data voltage (DATA) passes through the driving transistor T1 to the second storage electrode of the storage capacitor Cst. A gate electrode of the third transistor T3 is connected to the inverted scan line 152, and the first electrode of the third transistor T3 is connected to the second electrode of the driving transistor T1. A second electrode of the third transistor T3 is connected to the second storage electrode of the storage capacitor Cst, the gate electrode of the driving transistor T1, and the second electrode of the boost capacitor (Cboost). The third transistor T3 is turned on by a high voltage from among the inverted scan signals (GC) transmitted through the inverted scan line 152, to connect the gate electrode of the driving transistor T1 and the second electrode of the driving transistor T1, and to transmit the voltage applied to the gate electrode of the driving transistor T1 to the second storage electrode of the storage capacitor Cst and store the same in the storage capacitor Cst.

The fourth transistor T4 may be an n-type transistor, and may an oxide semiconductor (i.e., an oxide semiconductor layer). The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the second electrode of the boost capacitor (Cboost). The fourth transistor T4 is turned on by a high voltage from among the initialization control signals (GI) received through the initialization control line 153, and in response to the high voltage of the initialization control signal (GI), the fourth transistor T4 transmits the first initialization voltage (VINT) to the gate electrode of the driving transistor T1 and the second storage electrode of the storage capacitor Cst. Accordingly, the voltage at the gate electrode of the driving transistor T1 and the storage capacitor Cst are initialized.

The fifth transistor T5 may be a p-type transistor, and may include a polycrystalline semiconductor. The fifth transistor T5 transmits the driving voltage (ELVDD) to the driving transistor T1. A gate electrode of the fifth transistor T5 is connected to the emission control line 155, a first electrode of the fifth transistor T5 is connected to the driving voltage line 172, and a second electrode of the fifth transistor T5 is connected to the first electrode of the driving transistor T1.

The sixth transistor T6 may be a p-type transistor, and may include a polycrystalline semiconductor. The sixth transistor T6 transmits the driving current output by the driving transistor T1 to the light emitting diode (LED). A gate electrode of the sixth transistor T6 is connected to the emission control line 155, a first electrode of the sixth transistor T6 is connected to the second electrode of the driving transistor T1, and a second electrode of the sixth transistor T6 is connected to the anode of the light emitting diode (LED).

The seventh transistor T7 (i.e., a second initialization transistor) may be a p-type transistor, and may include a polycrystalline semiconductor. The seventh transistor T7 initializes the anode of the light emitting diode (LED). A gate electrode of the seventh transistor T7 is connected to the bypass control line 154, a first electrode of the seventh transistor T7 is connected to the anode of the light emitting diode (LED), and a second electrode of the seventh transistor T7 is connected to the second initialization voltage line 128. When the seventh transistor T7 is turned on by a low voltage from among the bypass signals (GB), the second initialization voltage (AINT) is applied to the anode of the light emitting diode (LED) to be initialized.

It has been described that one pixel includes seven transistors T1 to T7, one storage capacitor Cst, and one boost capacitor (Cboost), but the present exemplary embodiment is not limited thereto, and the number of transistors, the number of capacitors, and their connection relationships may be modified in various ways.

In the present exemplary embodiment, the driving transistor T1 may include a polycrystalline semiconductor. The third transistor T3 and the fourth transistor T4 may include oxide semiconductors. The second transistor T2, the fifth transistor T5, the sixth transistor T6, and the seventh transistor T7 may include polycrystalline semiconductors. However, they are not limited thereto, and at least any one of the second transistor T2, the fifth transistor T5, the sixth transistor T6, and the seventh transistor T7 may include oxide semiconductors. In the present exemplary embodiment, the third transistor T3 and the fourth transistor T4 include semiconductor materials that are different from the driving transistor T1, so their drive strength may be more stable and reliability may increase.

As described above, when a high voltage is applied to the scan line 151, a low voltage is applied to the inverted scan line 152, and when a low voltage is applied to the scan line 151, a high voltage is applied to the inverted scan line 152. For example, the inverted scan signal (GC) applied to the inverted scan line 152 includes a scan signal (GW) applied to the scan line 151 and an inverted signal, thereby lowering the gate voltage of the driving transistor T1 after the data are programmed. On the contrary, the scan signal (GW) raises the gate voltage of the driving transistor T1 through the boost capacitor (Cboost). Hence, when a black voltage is programmed, the black voltage may be reduced. In the present exemplary embodiment, by positioning the boost capacitor (Cboost) between the scan line 151 for applying a scan signal (GW) and the gate electrode of the driving transistor T1, the gate voltage of the driving transistor T1 may be increased such that the driving transistor T1 stably outputs a black voltage. As capacitance of the boost capacitor (Cboost) increases, the gate voltage of the driving transistor T1 may be further increased. The gate voltage of the driving transistor T1 may be controlled by controlling the capacitance of the boost capacitor (Cboost).

A planar and cross-sectional configuration of the driving transistor T1, the third transistor T3, the fourth transistor T4, and the seventh transistor T7 will now be described in further detail with reference to FIG. 2 to FIG. 10.

Figure 2:
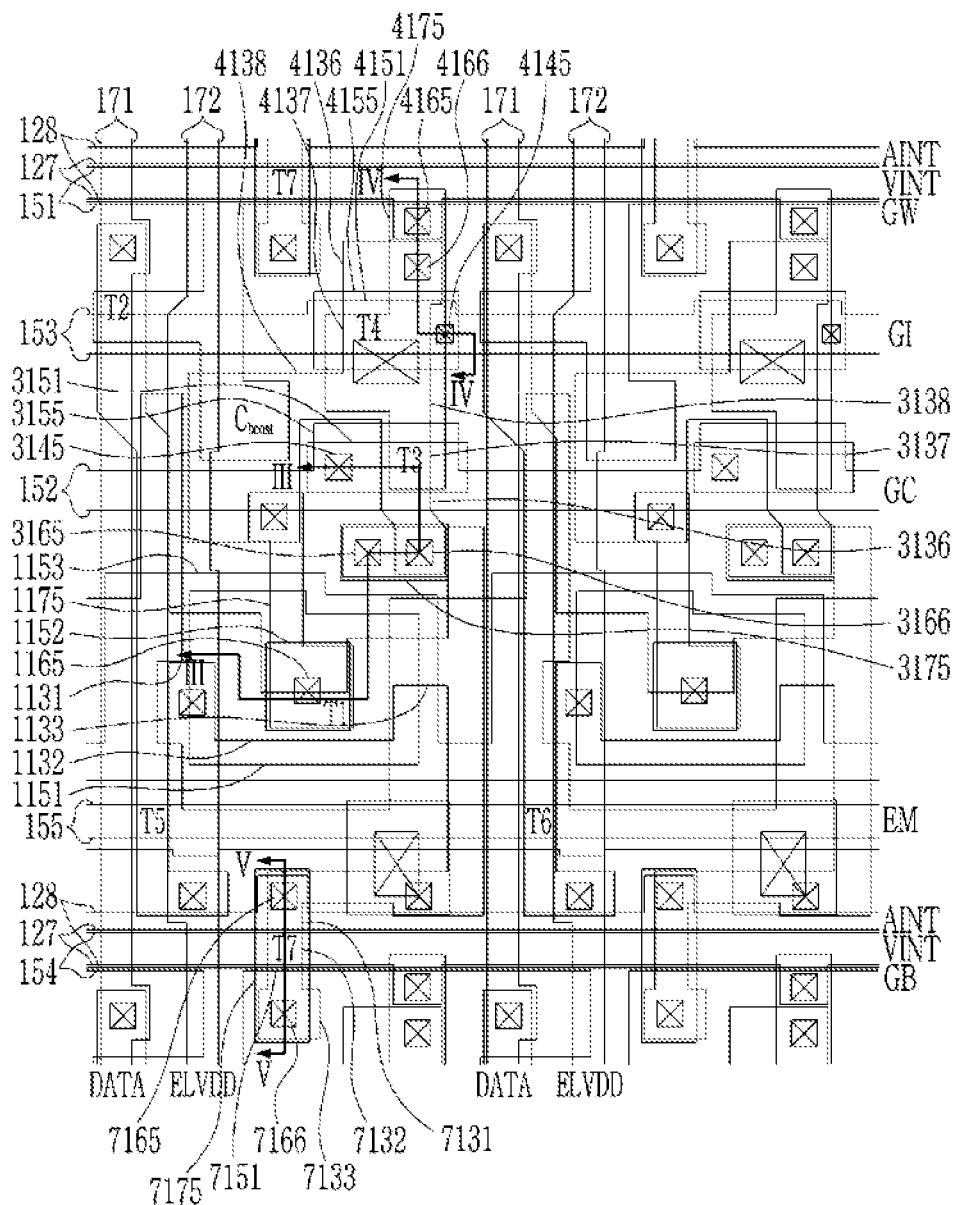
FIG. 2 shows a top plan view of a display device according to an exemplary embodiment.
Figure 3:
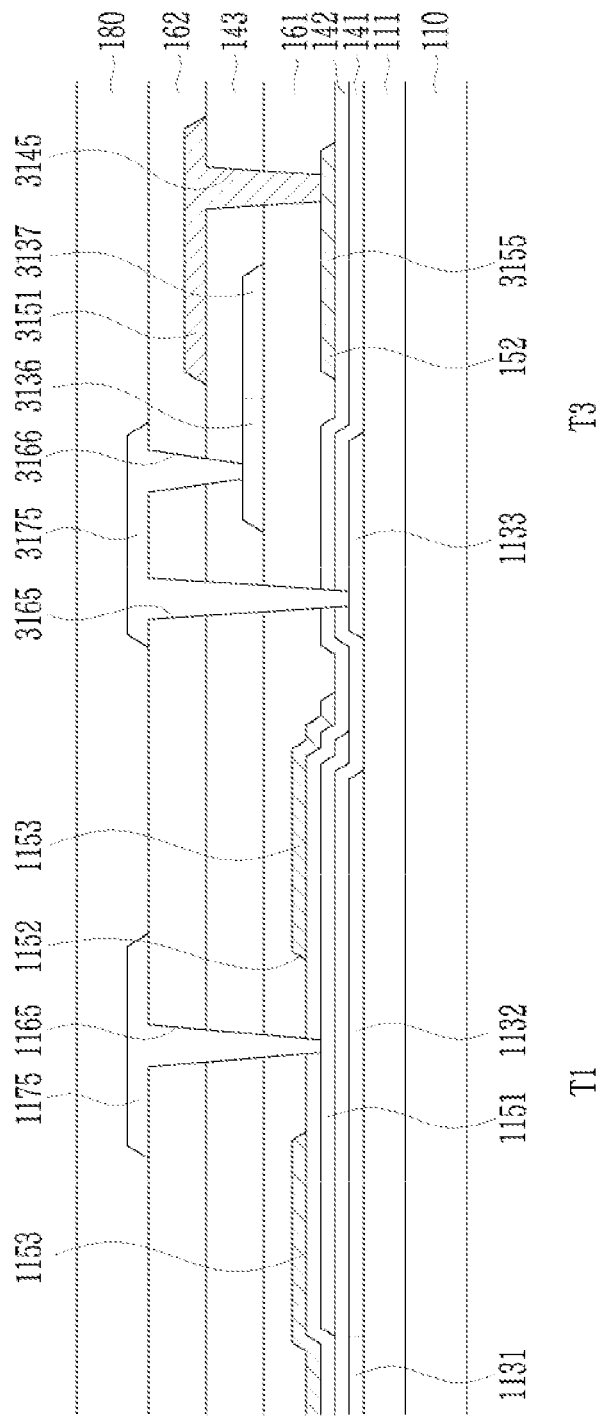
FIG. 3 shows a cross-sectional view with respect to a line of FIG. 2.
Figure 4:
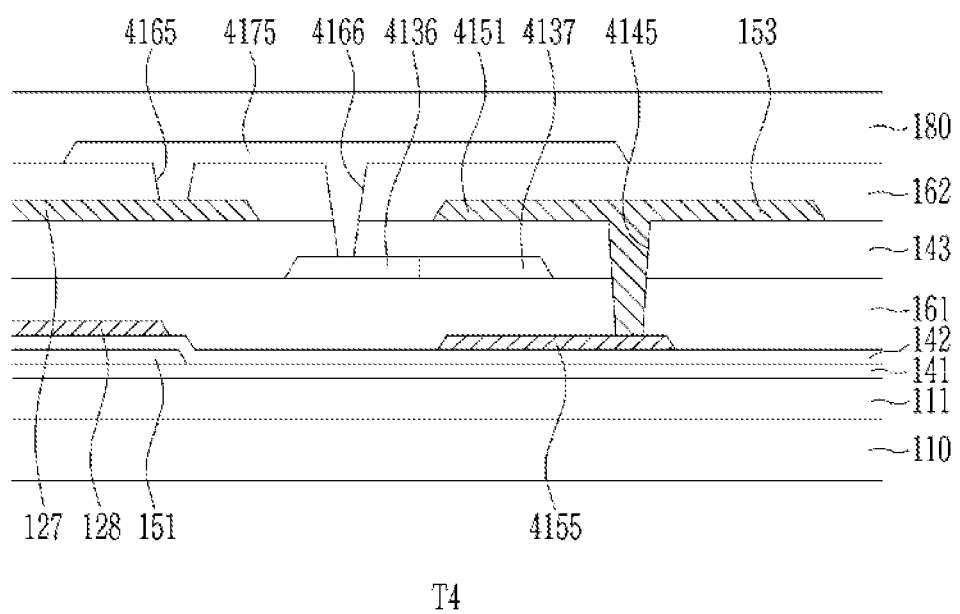
FIG. 4 shows a cross-sectional view with respect to a line IV-IV of FIG. 2.
Figure 5:
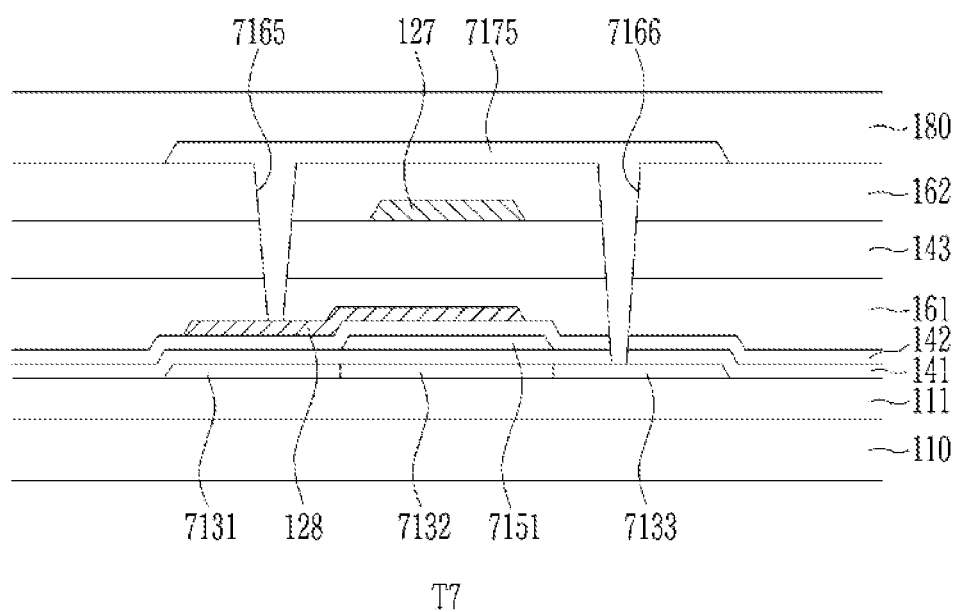
FIG. 5 shows a cross-sectional view with respect to a line V-V of FIG. 2.

FIG. 2 shows a top plan view of a display device according to an exemplary embodiment, FIG. 3 shows a cross-sectional view with respect to line III-III of FIG. 2, FIG. 4 shows a cross-sectional view with respect to line IV-IV of FIG. 2, and FIG. 5 shows a cross-sectional view with respect to line V-V of FIG. 2. FIG. 6 to FIG. 10 show sequentially top plan views following an order of manufacturing a display device according to an exemplary embodiment. FIG. 2 to FIG. 10 show two adjacent pixels which may substantially have the same shape to each other. The display device may include a plurality of pixels which may be repeatedly arranged to form a display region.

Figure 6:
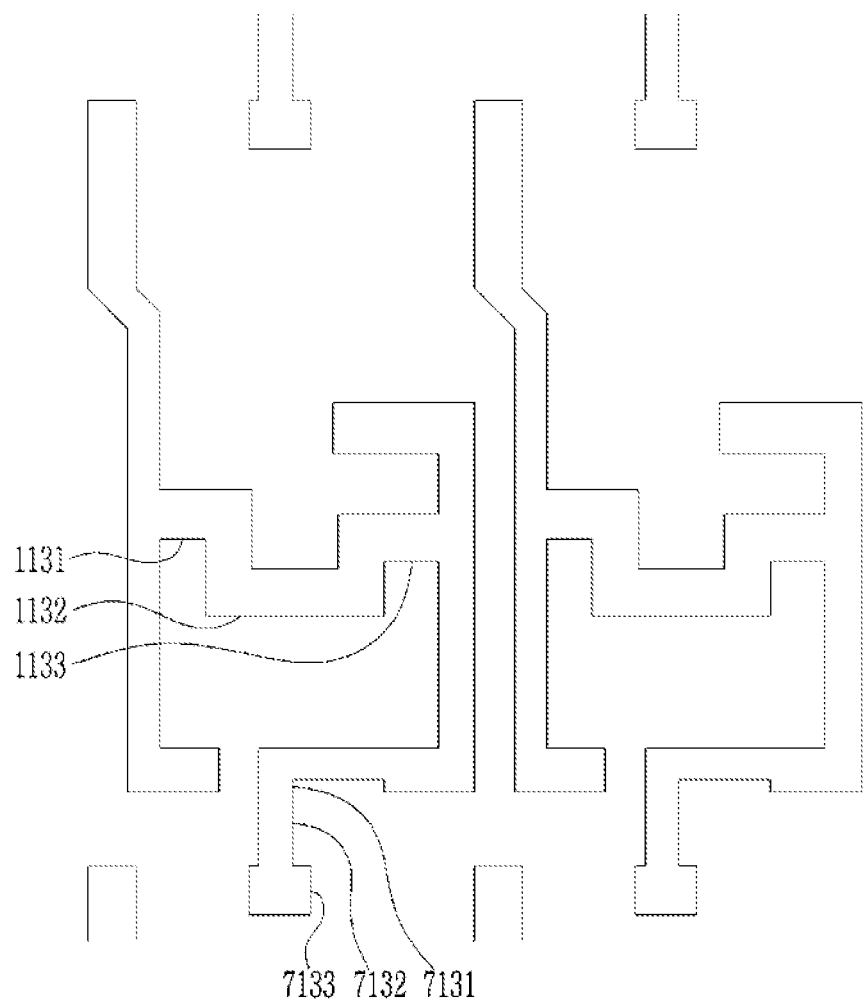
FIG. 6 to FIG. 10 show sequential top plan views according to an order for manufacturing a display device according to an exemplary embodiment.

As shown in FIG. 2 to FIG. 10, a polycrystalline semiconductor (i.e., a polycrystalline semiconductor layer) may be positioned on a substrate 110. The polycrystalline semiconductor may include a channel 1132, a first electrode 1131, and a second electrode 1133 of the driving transistor T1, and a channel 7132, a first electrode 7131, and a second electrode 7133 of the seventh transistor T7. FIG. 6 shows a polycrystalline semiconductor. The polycrystalline semiconductor may further include a channel, a first electrode, and a second electrode of the second transistor T2, the fifth transistor T5, and the sixth transistor T6.

The channel 1132 of the driving transistor T1 may be bent in a plan view. The shape of the channel 1132 of the driving transistor T1 is not limited thereto, and it is modifiable in various ways. For example, the channel 1132 of the driving transistor T1 may be bent in another shape, and it may have a bar shape. The first electrode 1131 and the second electrode 1133 of the driving transistor T1 may be positioned on opposite sides of the channel 1132 of the driving transistor T1. The first electrode 1131 of the driving transistor T1 may extend from a top side to a bottom side in a plan view, and a portion of the first electrode 1131, extending upward, may be connected to the second electrode of the second transistor T2, while a portion of the first electrode 1131, extending downward, may be connected to the second electrode of the fifth transistor T5. The second electrode 1133 of the driving transistor T1 may extend downward in a plan view and may be connected to the first electrode of the sixth transistor T6.

The channel 7132 of the seventh transistor T7 may have a bar shape in a plan view. The shape of the channel 7132 of the seventh transistor T7 is not limited thereto, and it is modifiable in various ways. The first electrode 7131 and the second electrode 7133 of the seventh transistor T7 may be formed on opposite sides of the channel 7132 of the seventh transistor T7. The first electrode 7131 of the seventh transistor T7 may be formed on an upper side of the channel 7132 in a plan view. The first electrode 7131 of the seventh transistor T7 may extend on the upper side and may reach the second electrode of the sixth transistor T6 in a plan view. The second electrode 7133 of the seventh transistor T7 may be formed on the lower side of the channel 7132 in a plan view.

A buffer layer 111 may be formed between the substrate 110 and a polycrystalline semiconductor including the channel 1132, the first electrode 1131, and the second electrode 1133 of the driving transistor T1 and the channel 7132, the first electrode 7131, and the second electrode 7133 of the seventh transistor T7. The buffer layer 111 may have a single-layered or multi-layered structure. The buffer layer 111 may include an organic insulating material or an inorganic insulating material.

A first gate insulating layer 141 may be formed on the polycrystalline semiconductor including the channel 1132, the first electrode 1131, and the second electrode 1133 of the driving transistor T1 and the channel 7132, the first electrode 7131, and the second electrode 7133 of the seventh transistor T7. The first gate insulating layer 141 may include silicon nitride or silicon oxide.

Figure 7:
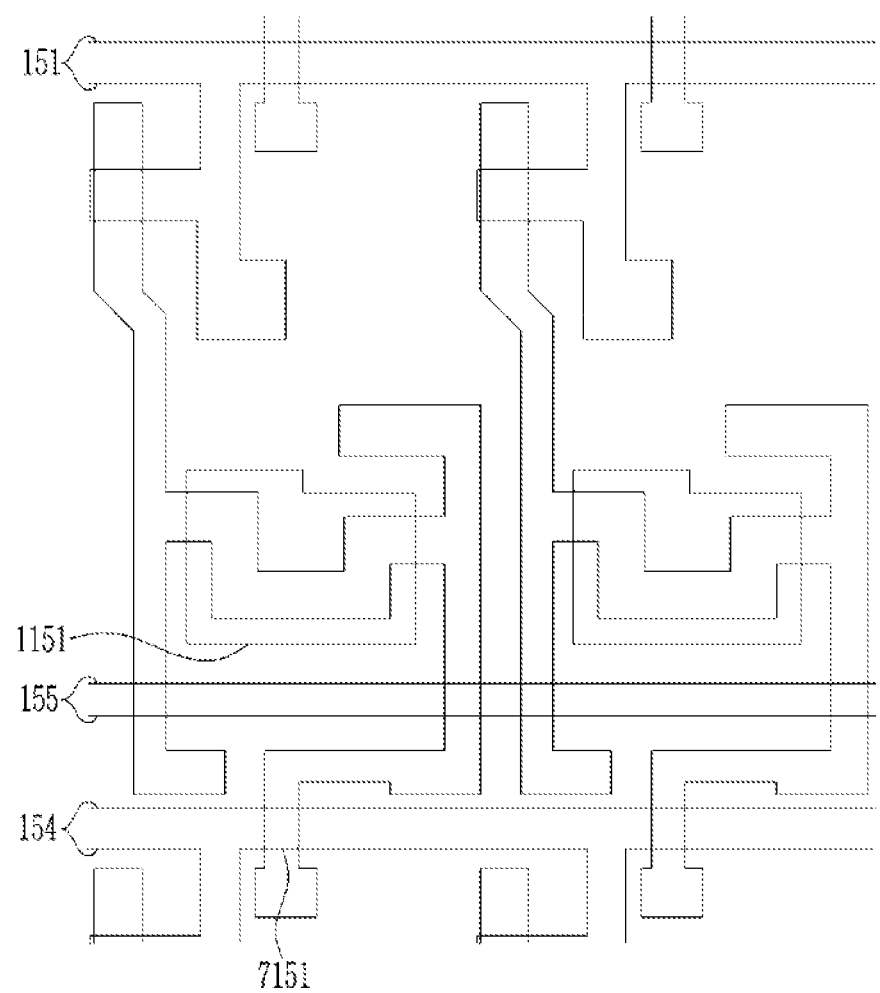

A first gate conductor including a gate electrode 1151 of the driving transistor T1 and a gate electrode 7151 of the seventh transistor T7 may be formed on the first gate insulating layer 141. FIG. 7 shows a polycrystalline semiconductor and the first gate conductor.

The gate electrode 1151 of the driving transistor T1 may overlap the channel 1132 of the driving transistor T1. The channel 1132 of the driving transistor T1 is covered by the gate electrode 1151 of the driving transistor T1. The gate electrode 7151 of the seventh transistor T7 may overlap the channel 7132 of the seventh transistor T7. The channel 7132 of the seventh transistor T7 is covered by the gate electrode 7151 of the seventh transistor T7.

The first gate conductor may further include a scan line 151, an emission control line 155, and a bypass control line 154. The scan line 151, the emission control line 155, and the bypass control line 154 may substantially extend in a horizontal direction. The scan line 151 may extend downward to reach the gate electrode of the second transistor T2 and the first electrode of the boost capacitor (Cboost) in a plan view. The gate electrode of the fifth transistor T5 and the gate electrode of the sixth transistor T6 may be connected to the emission control line 155. The gate electrode 7151 of the seventh transistor T7 may be connected to the bypass control line 154. The bypass control line 154 may be a scan line of the next pixel.

A first gate conductor including the gate electrode 1151 of the driving transistor T1 and the gate electrode 7151 of the seventh transistor T7 may be formed, and a doping process may then be performed. The polycrystalline semiconductor covered by the first gate conductor may be doped, and a portion of the polycrystalline semiconductor not covered by the first gate conductor may be doped to be conductive. For example, the doping process may be performed with a p-type dopant, and the driving transistor T1 including a polycrystalline semiconductor, the second transistor T2, the fifth transistor T5, the sixth transistor T6, and the seventh transistor T7 may be a p-type transistor.

A second gate insulating layer 142 may be formed on the first gate conductor including the gate electrode 1151 of the driving transistor T1 and the gate electrode 7151 of the seventh transistor T7, and the first gate insulating layer 141. The second gate insulating layer 142 may include silicon nitride or silicon oxide.

Figure 8:
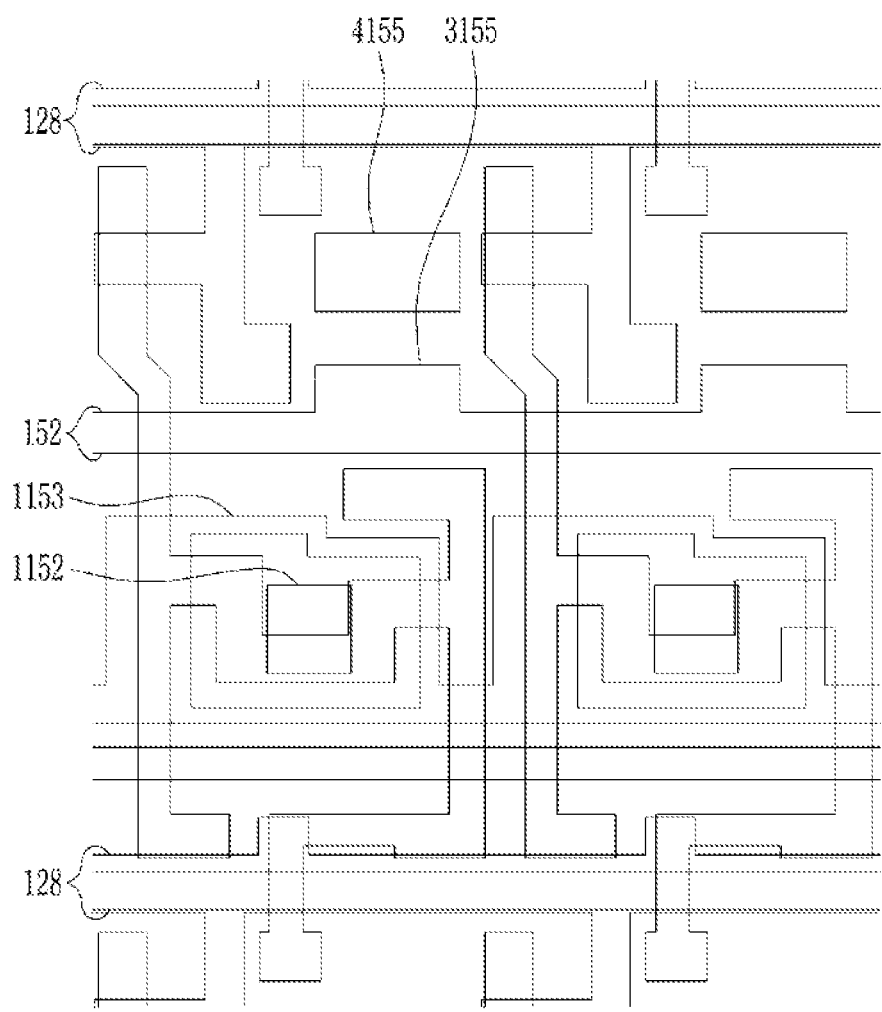

A second gate conductor including a first storage electrode 1153 of the storage capacitor Cst, a light blocking layer 3155 of the third transistor T3, and a light blocking layer 4155 of the fourth transistor T4 may be formed on the second gate insulating layer 142. FIG. 8 shows the polycrystalline semiconductor, the first gate conductor, and the second gate conductor.

The first storage electrode 1153 overlaps the gate electrode 1151 of the driving transistor T1 to configure the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap a channel 3137 and a gate electrode 3151 of the third transistor T3. The light blocking layer 4155 of the fourth transistor T4 may overlap a channel 4137 and a gate electrode 4151 of the fourth transistor T4.

The second gate conductor may further include a second initialization voltage line 128 and an inverted scan line 152. The second initialization voltage line 128 and the inverted scan line 152 may substantially extend in a horizontal direction. The second initialization voltage line 128 may overlap the channel 7132 and the first electrode 7131 of the seventh transistor T7. The second initialization voltage line 128 may overlap the gate electrode 7151 of the seventh transistor T7. The inverted scan line 152 may be connected to the light blocking layer 3155 of the third transistor T3.

A first interlayer insulating layer 161 may be formed on the second gate conductor including a first storage electrode 1153 of the storage capacitor Cst, a light blocking layer 3155 of the third transistor T3, and a light blocking layer 4155 of the fourth transistor T4. The first interlayer insulating layer 161 may include a silicon nitride or a silicon oxide.

Figure 9:
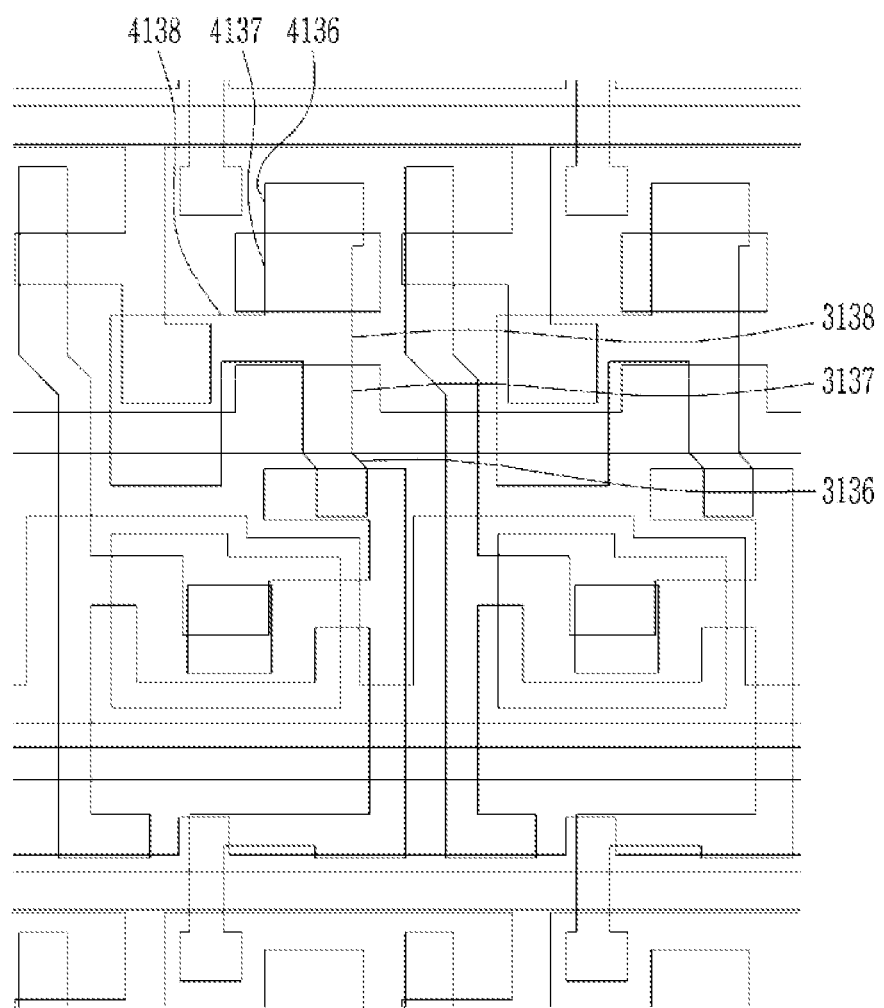

An oxide semiconductor (i.e., an oxide semiconductor layer) including the channel 3137, the first electrode 3136, and the second electrode 3138 of the third transistor T3 and the channel 4137, a first electrode 4136, and a second electrode 4138 of the fourth transistor T4 may be formed on the first interlayer insulating layer 161. FIG. 9 shows the polycrystalline semiconductor, the first gate conductor, the second gate conductor, and the oxide semiconductor.

The oxide semiconductor may include: at least one of unary metal oxides such as an indium (In) oxide, a tin (Sn) oxide, or a zinc (Zn) oxide; binary metal oxides such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; ternary metal oxides such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and quaternary metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor may include an indium-gallium-zinc oxide (IGZO) from among the In—Ga—Zn-based oxide.

The channel 3137, the first electrode 3136, and the second electrode 3138 of the third transistor T3 and the channel 4137, the first electrode 4136, and the second electrode 4138 of the fourth transistor T4 may be connected to each other and may be integrally formed. The first electrode 3136 and the second electrode 3138 of the third transistor T3 may be formed on opposite sides of the channel 3137 of the third transistor T3. The first electrode 4136 and the second electrode 4138 of the fourth transistor T4 may be formed on opposite sides of the channel 4137 of the fourth transistor T4. The second electrode 3138 of the third transistor T3 may be connected to the second electrode 4138 of the fourth transistor T4. The channel 3137 of the third transistor T3 may overlap the light blocking layer 3155. The channel 4137 of the fourth transistor T4 may overlap the light blocking layer 4155.

The oxide semiconductor may further include a second electrode of the boost capacitor (Cboost). The second electrode of the boost capacitor (Cboost) may be connected to the second electrode 3138 of the third transistor T3. The second electrode of the boost capacitor (Cboost) may be connected to the second electrode 4138 of the fourth transistor T4. The second electrode of the boost capacitor (Cboost) may overlap the first electrode of the boost capacitor (Cboost). Capacitance of the boost capacitor (Cboost) may be determined by an overlapping area of the first electrode and the second electrode of the boost capacitor (Cboost), and a thickness of the second gate insulating layer 142 and the first interlayer insulating layer 161 between the first electrode and the second electrode of the boost capacitor (Cboost).

A third gate insulating layer 143 may be formed on the oxide semiconductor including the channel 3137, the first electrode 3136, and the second electrode 3138 of the third transistor T3 and the channel 4137, the first electrode 4136, and the second electrode 4138 of the fourth transistor T4. The third gate insulating layer 143 may be formed on the oxide semiconductor and an entire side of the first interlayer insulating layer 161. Therefore, the third gate insulating layer 143 may cover upper sides and lateral sides of the channel 3137, the first electrode 3136, and the second electrode 3138 of the third transistor T3 and the channel 4137, the first electrode 4136, and the second electrode 4138 of the fourth transistor T4. However, the present exemplary embodiment is not limited thereto, and the third gate insulating layer 143 may not be formed on entire sides of the oxide semiconductor and the first interlayer insulating layer 161. For example, the third gate insulating layer 143 may overlap the channel 3137 of the third transistor T3 without overlapping the first electrode 3136 and the second electrode 3138. The third gate insulating layer 143 may overlap the channel 4137 of the fourth transistor T4 without overlapping the first electrode 4136 and the second electrode 4138.

Figure 10:
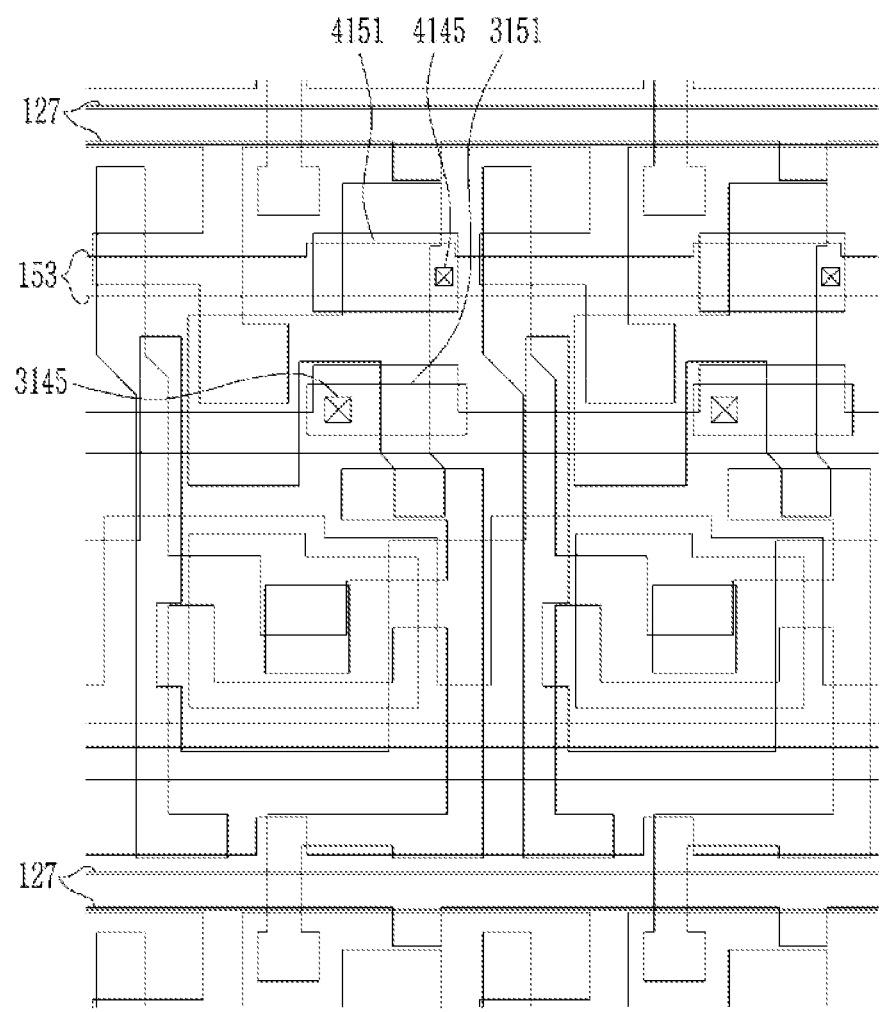

A third gate conductor including the gate electrode 3151 of the third transistor T3 and the gate electrode 4151 of the fourth transistor T4 may be formed on the third gate insulating layer 143. FIG. 10 shows the polycrystalline semiconductor, the first gate conductor, the second gate conductor, the oxide semiconductor, and the third gate conductor.

The gate electrode 3151 of the third transistor T3 may overlap the channel 3137 of the third transistor T3. The gate electrode 3151 of the third transistor T3 may overlap at least one of the inverted scan line 152 and the light blocking layer 3155 of the third transistor T3. The first interlayer insulating layer 161 and the third gate insulating layer 143 may be formed between the gate electrode 3151 of the third transistor T3 and the inverted scan line 152 and between the gate electrode 3151 of the third transistor T3 and the light blocking layer 3155. A first opening 3145 may be formed in the third gate insulating layer 143 and the first interlayer insulating layer 161. The first opening 3145 may overlap (i.e., expose) at least part of at least one of the inverted scan line 152 and the light blocking layer 3155 of the third transistor T3. The gate electrode 3151 of the third transistor T3 may be connected to at least one of the inverted scan line 152 and the light blocking layer 3155 of the third transistor T3 through the first opening 3145. The gate electrode 3151 and the light blocking layer 3155 of the third transistor T3 may receive an inverted scan signal (GC) through the inverted scan line 152.

The gate electrode 4151 of the fourth transistor T4 may overlap the channel 4137 of the fourth transistor T4. The third gate conductor may further include an initialization control line 153. The initialization control line 153 may substantially extend in the horizontal direction. The gate electrode 4151 of the fourth transistor T4 may be connected to the initialization control line 153. At least one of the gate electrode 4151 of the fourth transistor T4 and the initialization control line 153 may overlap the light blocking layer 4155 of the fourth transistor T4. The first interlayer insulating layer 161 and the third gate insulating layer 143 may be formed between the gate electrode 4151 and the light blocking layer 4155 of the fourth transistor T4 and between the initialization control line 153 and the light blocking layer 4155 of the fourth transistor T4. A second opening 4145 may be formed in the third gate insulating layer 143 and the first interlayer insulating layer 161. The second opening 4145 may overlap (i.e., expose) at least part of the light blocking layer 4155 of the fourth transistor T4. At least one of the gate electrode 4151 of the fourth transistor T4 and the initialization control line 153 may be connected to the light blocking layer 4155 of the fourth transistor T4 through the second opening 4145. The gate electrode 4151 and the light blocking layer 4155 of the fourth transistor T4 may receive the initialization control signal (GI) through the initialization control line 153.

The third gate conductor may further include a first initialization voltage line 127. The first initialization voltage line 127 may substantially extend in the horizontal direction. The first initialization voltage line 127 may extend in parallel with the initialization control line 153. The first initialization voltage line 127 may extend in parallel with the second initialization voltage line 128 and the scan line 151. The first initialization voltage line 127 may overlap the second initialization voltage line 128 and the scan line 151. The scan line 151 may be insulated from the second initialization voltage line 128 with the second gate insulating layer 142 therebetween. The second initialization voltage line 128 may be insulated from the first initialization voltage line 127 with the first interlayer insulating layer 161 and the third gate insulating layer 143 therebetween. In an exemplary embodiment, the second initialization voltage line 128 and the first initialization voltage line 127 are positioned on different layers from each other. For example, second initialization voltage line 128 may be disposed on (or may contact) the second gate insulating layer 142, and the first initialization voltage line 127 may be disposed on (or may contact) the third gate insulating layer 143 different from the second gate insulating layer 142.

A third gate conductor including a gate electrode 3151 of the third transistor T3 and a gate electrode 4151 of the fourth transistor T4 may be formed, and a doping process may be performed on the gate conductor. A portion of the oxide semiconductor covered by the third gate conductor may not be doped, and a portion of the oxide semiconductor not covered by the third gate conductor may be doped to have a same characteristic as the conductor. The channel 3137 of the third transistor T3 may be positioned below the gate electrode 3151 to overlap with the gate electrode 3151. The first electrode 3136 and the second electrode 3138 of the third transistor T3 may not overlap the gate electrode 3151. The channel 4137 of the fourth transistor T4 may be positioned below the gate electrode 4151 to overlap with the gate electrode 4151. The first electrode 4136 and the second electrode 4138 of the fourth transistor T4 may not overlap with the gate electrode 4151. The doping process of the oxide semiconductor may be performed with an n-type dopant, and the third transistor T3 and the fourth transistor T4 including oxide semiconductors may have an n-type transistor characteristic.

A second interlayer insulating layer 162 may be formed on the third gate conductor including the gate electrode 3151 of the third transistor T3 and the gate electrode 4151 of the fourth transistor T4. A third opening 1165, a fourth opening 3165, a fifth opening 3166, a sixth opening 4165, a seventh opening 4166, an eighth opening 7165, and a ninth opening 7166 may be formed in the second interlayer insulating layer 162.

The third opening 1165 may expose at least part of the gate electrode 1151 of the driving transistor T1. The third opening 1165 may further be formed in the third gate insulating layer 143, the first interlayer insulating layer 161, and the second gate insulating layer 142. The third opening 1165 may overlap the opening 1152 of the first storage electrode 1153. For example, the third opening 1165 may be disposed in the opening 1152 in a top down view. In an exemplary embodiment, the third opening 1165 may penetrate part of the second gate insulating layer 142 exposed by the 1152 and expose part of the first gate insulating layer 141. The third opening 1165 may be formed in the opening 1152 of the first storage electrode 1153. The fourth opening 3165 may overlap at least part of the second electrode 1133 of the driving transistor T1.

The fourth opening 3165 may be formed in the third gate insulating layer 143, the first interlayer insulating layer 161, the second gate insulating layer 142, and the first gate insulating layer 141. The fifth opening 3166 may expose at least part of the first electrode 3136 of the third transistor T3. The fifth opening 3166 may be formed in the third gate insulating layer 143.

The sixth opening 4165 may expose at least part of the first initialization voltage line 127. The seventh opening 4166 may expose at least part of the first electrode 4136 of the fourth transistor T4. The seventh opening 4166 may be formed in the third gate insulating layer 143.

The eighth opening 7165 may expose at least part of the second initialization voltage line 128. The eighth opening 7165 may be formed in the third gate insulating layer 143 and the first interlayer insulating layer 161. The ninth opening 7166 may expose at least part of the second electrode 7133 of the seventh transistor T7. The ninth opening 7166 may be formed in the third gate insulating layer 143, the first interlayer insulating layer 161, the second gate insulating layer 142, and the first gate insulating layer 141.

A first connection electrode 1175, a second connection electrode 3175, a third connection electrode 4175, a fourth connection electrode 7175, a data line 171, and a driving voltage line 172 may be formed on the second interlayer insulating layer 162.

The first connection electrode 1175 may overlap the gate electrode 1151 of the driving transistor T1. The first connection electrode 1175 may be connected to the gate electrode 1151 of the driving transistor T1 through the third opening 1165 and the opening 1152 of the first storage electrode 1153. The first connection electrode 1175 may overlap the boost capacitor (Cboost). The first connection electrode 1175 may be connected to the second electrode of the boost capacitor (Cboost). Therefore, the gate electrode 1151 of the driving transistor T1 may be connected to the second electrode of the boost capacitor (Cboost) by the first connection electrode 1175.

The second connection electrode 3175 may overlap the second electrode 1133 of the driving transistor T1. The second connection electrode 3175 may be connected to the second electrode 1133 of the driving transistor T1 through the fourth opening 3165. The second connection electrode 3175 may overlap the first electrode 3136 of the third transistor T3. The second connection electrode 3175 may be connected to the first electrode 3136 of the third transistor T3 through the fifth opening 3166. Therefore, the second electrode 1133 of the driving transistor T1 may be connected to the first electrode 3136 of the third transistor T3 by the second connection electrode 3175.

The third connection electrode 4175 may overlap the first initialization voltage line 127. The third connection electrode 4175 may be connected to the first initialization voltage line 127 through the sixth opening 4165. The third connection electrode 4175 may overlap the first electrode 4136 of the fourth transistor T4. The third connection electrode 4175 may be connected to the first electrode 4136 of the fourth transistor T4 through the seventh opening 4166. Therefore, the first initialization voltage line 127 may be connected to the first electrode 4136 of the fourth transistor T4 by the third connection electrode 4175.

The fourth connection electrode 7175 may overlap the second initialization voltage line 128. The fourth connection electrode 7175 may be connected to the second initialization voltage line 128 through the eighth opening 7165. The fourth connection electrode 7175 may overlap the second electrode 7133 of the seventh transistor T7. The fourth connection electrode 7175 may be connected to the second electrode 7133 of the seventh transistor T7 through the ninth opening 7166. Therefore, the second initialization voltage line 128 may be connected to the second electrode 7133 of the seventh transistor T7 by the fourth connection electrode 7175.

The data line 171 and the driving voltage line 172 may substantially extend in the vertical direction. The data line 171 may be connected to the second transistor T2. The data line 171 may be connected to the first electrode of the second transistor T2. The driving voltage line 172 may be connected to the fifth transistor T5. The driving voltage line 172 may be connected to the first electrode of the fifth transistor T5. The driving voltage line 172 may be connected to the storage capacitor Cst. The driving voltage line 172 may be connected to the first storage electrode 1153 of the storage capacitor Cst. The first storage electrodes 1153 of the storage capacitors Cst of the adjacent pixels are connected to each other, and they may substantially extend in the horizontal direction.

A third interlayer insulating layer 180 may be formed on the first connection electrode 1175, the second connection electrode 3175, the third connection electrode 4175, the fourth connection electrode 7175, the data line 171, and the driving voltage line 172.

Although not shown, an anode of a light emitting diode (LED) may be formed on the third interlayer insulating layer 180. The anode may be connected to the sixth transistor T6, and may receive an output current of the driving transistor T1. A partition wall may be formed on the anode. An opening is formed in the partition wall, and the opening in the partition wall may overlap the anode. A light-emitting device layer may be formed in the opening in the partition wall. A cathode may be formed on the light-emitting device layer and the partition wall. The anode, the light-emitting device layer, and the cathode may configure the light emitting diode (LED).

Regarding the display device according to an exemplary embodiment, the driving transistor T1 may include a polycrystalline semiconductor, and the third transistor T3 and the fourth transistor T4 may include oxide semiconductors. The third transistor T3 and the fourth transistor T4 include semiconductor materials that are different from the driving transistor T1, so their drive strength may be more stable, and reliability may increase.

Further, the third transistor T3 including an oxide semiconductor may include a light blocking layer 3155, and the fourth transistor T4 may include a light blocking layer 4155. The light blocking layer 3155 of the third transistor T3 and the light blocking layer 4155 of the fourth transistor T4 may be formed on a same layer (e.g., the second gate insulating layer 142) as the first storage electrode 1153 of the storage capacitor Cst, they may be made of the same material, and they may be formed using the same process. In an exemplary embodiment, the light blocking layer 3155 of the third transistor T3, the light blocking layer 4155 of the fourth transistor T4 and the first storage electrode 1153 may be formed on the same layer of the second gate insulating layer 142. The light blocking layer 3155 of the third transistor T3 and the light blocking layer 4155 of the fourth transistor T4 may be formed on a same layer (e.g., the second gate insulating layer 142) as the second initialization voltage line 128, they may be made of the same material, and they may be formed using the same process. In an exemplary embodiment, the light blocking layer 3155 of the third transistor T3, the light blocking layer 4155 of the fourth transistor T4 and the second initialization voltage line 128 may be formed on the same layer of the second gate insulating layer 142. The light blocking layer 3155 of the third transistor T3 may receive the same signal as the gate electrode 3151, and the third transistor T3 may have a double-gate structure. The light blocking layer 4155 of the fourth transistor T4 may receive the same signal as the gate electrode 4151, and the fourth transistor T4 may have a double-gate structure. As described, the third transistor T3 and the fourth transistor T4 respectively have a configuration including the light blocking layers 3155 and 4155 without an additional process, thereby preventing a leakage current from occurring in the third transistor T3 and the fourth transistor T4. Hence, the device characteristics and reliability may increase.

The fourth transistor T4 and the seventh transistor T7 are not connected to the same initialization voltage line, but are connected to different initialization voltage lines. The fourth transistor T4 may be connected to the first initialization voltage line 127, and may receive a first initialization voltage (VINT). The seventh transistor T7 may be connected to the second initialization voltage line 128, and may receive a second initialization voltage (AINT). When the fourth transistor T4 and the seventh transistor T7 are connected to the same initialization voltage line, the same initialization voltage is applied to the fourth transistor T4 and the seventh transistor T7. The organic light emitting device may be driven with a changed frequency. For example, a frequency of 120 Hz may be changed to 60 Hz, 30 Hz, or 1 Hz. When the organic light emitting device is driven with the changed frequency, deviation may be generated to a variable refresh rate (VRR) characteristic. For example, greater deviation may be generated in a region indicating a low gray. In the present exemplary embodiment, different initialization voltages may be applied to the fourth transistor T4 and the seventh transistor T7. Therefore, the deviation of the VRR characteristic may be reduced in the low gray by allowing the first initialization voltage (VINT) applied to the fourth transistor T4 to be different from the second initialization voltage (AINT) applied to the seventh transistor T7.

In the present exemplary embodiment, the first initialization voltage line 127 may overlap the second initialization voltage line 128. The fourth transistor T4 may be connected to the first initialization voltage line 127 through the third connection electrode 4175 and may receive the first initialization voltage (VINT). The seventh transistor T7 may be connected to the second initialization voltage line 128 through the fourth connection electrode 7175 and may receive the second initialization voltage (AINT).

While this disclosure has been described in connection with what is presently considered to be practical exemplary embodiments, it is to be understood that the invention is not limited to the disclosed embodiments, but on the contrary, is intended to cover various modifications and equivalent arrangements included within the spirit and scope of the appended claims.

What is claimed is:

1. A display device comprising:
   a substrate;
   a polycrystalline semiconductor layer on the substrate, the polycrystalline semiconductor layer including a channel, a first electrode, and a second electrode of a driving transistor and a channel, a first electrode, and a second electrode of a seventh transistor;
   a gate electrode of the driving transistor overlapping the channel of the driving transistor;
   a gate electrode of the seventh transistor overlapping the channel of the seventh transistor;
   an oxide semiconductor layer on the substrate, the oxide semiconductor layer including a channel, a first electrode, and a second electrode of a fourth transistor;
   a gate electrode of the fourth transistor overlapping the channel of the fourth transistor;
   a first initialization voltage line connected to the first electrode of the fourth transistor, wherein the first initialization voltage line and the gate electrode of the fourth transistor are positioned on a same layer, wherein the second electrode of the fourth transistor is connected to the gate electrode of the driving transistor;
   a second initialization voltage line connected to the second electrode of the seventh transistor, wherein the second initialization voltage line and the first initialization voltage line are positioned on different layers from each other; and
   a light emitting diode (LED) connected to the driving transistor and the first electrode of the seventh transistor.

2. The display device of claim 1, wherein
   the first initialization voltage line overlaps the second initialization voltage line.

3. The display device of claim 2, further comprising:
   a scan line overlapping the first initialization voltage line and the second initialization voltage line;
   a data line overlapping the first initialization voltage line and the second initialization voltage line; and
   a second transistor connected to the scan line and the data line.

4. The display device of claim 3, further comprising
   a connection electrode for connecting the first initialization voltage line and the first electrode of the fourth transistor.

5. The display device of claim 4, further comprising
   an insulating layer positioned between the first initialization voltage line and the connection electrode and between the first electrode of the fourth transistor and the connection electrode,
   wherein the insulating layer includes
   a first opening exposing the first initialization voltage line and a second operons exposing the first electrode of the fourth transistor,
the connection electrode is connected to the first initialization voltage line through the first opening, and
the connection electrode is connected to the first electrode of the fourth transistor through the second opening.

6. The display device of claim 5,
wherein the connection electrode and the data line are on a same layer, and
wherein the connection electrode overlaps the first initialization voltage line and the first electrode of fourth transistor.

7. The display device of claim 3, further comprising a connection electrode for connecting the second initialization voltage line and the second electrode of the seventh transistor.

8. The display device of claim 7, further comprising an insulating layer positioned between the second initialization voltage hne and the connection electrode and between the second electrode of the seventh transistor and the connection electrode,
wherein the insulating layer includes
a first opening exposing the second initialization voltage line and
a second opening exposing the second electrode of the seventh transistor,
the connection electrode is connected to the second initialization voltage line through the first opening, and
the connection electrode is connected to the second electrode of the seventh transistor through the second opening.

9. The display device of claim 8,
wherein the connection electrode and the data line are disposed on a same layer, and
wherein the connection electrode overlaps the second initialization voltage line and the second electrode of the seventh transistor.

10. The display device of claim 1, wherein
a first initialization voltage is applied via, the first initialization voltage line to the first electrode of the fourth transistor,
a second initialization voltage is applied via the second initialization voltage line to the second electrode of the seventh transistor, and
the first initialization voltage is different from the second initialization voltage.

11. The display device of claim 1, further comprising:
a first storage electrode overlapping the gate electrode of the driving transistor,
wherein the second initialization voltage line and the first storage electrode are on a same layer,
wherein the oxide semiconductor layer further include a channel, a first electrode, and a second electrode of a third transistor positioned, and
where in the channel of the third transistor and the channel of the fourth transistor are positioned on a same layer.

12. The display device of claim 11, further comprising a light blocking layer of the fourth transistor overlapping the channel of the north transistor,
wherein the light blocking layer of the fourth transistor and the first storage electrode are on a same layer.

13. The display device of claim 11, further comprising:
a gate electrode of the third transistor overlapping the channel of the third transistor;
a light blocking layer of the third transistor overlapping the channel of the third transistor, wherein the light blocking layer of the third transistor and the first storage electrode are positioned on a same layer; and
a connection electrode connecting the second electrode of the driving transistor and the first electrode of the third transistor.

14. The display of claim 1, wherein
the display device includes a plurality of pixels,
each of the plurality of pixels includes the driving transistor, the fourth transistor, and the seventh transistor, and
the plurality of pixels have the same shape as each other.

15. A display device comprising:
a light emitting diode (LED) connected between a driving voltage line for applying a driving voltage to an anode of the light emitting diode and a common voltage line for applying a common voltage to a cathode of the light emitting diode;
a driving transistor connected between the driving voltage line and the anode of the light emitting diode (LED) and configured to supply a driving current to the light emitting diode;
a second transistor connected between a first electrode of the driving transistor connected to the driving voltage line and a data line to which a data voltage is applied;
a third transistor connected between a second electrode of the driving transistor connected to the light emitting, diode (LED) and a gate electrode of the driving transistor;
a fourth transistor connected between the gate electrode of the driving transistor and a first initialization voltage line to which a first initialization voltage is applied;
a seventh transistor connected between the anode of the light emitting diode (LED) and a second initialization voltage line to which a second initialization voltage is applied;
a storage capacitor connected between the driving voltage line and the gate electrode of the driving transistor,
wherein each of the driving transistor and the second transistor includes a polycrystalline semiconductor layer, and
wherein each of the third transistor and the fourth transistor includes an oxide semiconductor layer; and
a scan line connected to the second transistor and receiving a scan signal,
wherein the scan line overlaps the first initialization voltage line and the second initialization voltage line.

16. The display device of claim 15, wherein
the first initialization voltage line overlaps the second initialization voltage line.

17. The display device of claim 15, further comprising:
a first connection electrode connecting the first initialization voltage line and the fourth transistor; and
a second connection electrode connecting the second initialization voltage line and the seventh transistor.

18. The display device of claim 15, wherein
the driving transistor, the second transistor, and the seventh transistor are p-type transistors, and
the third transistor and the fourth transistor are n-type transistors.

19. The display device of claim 18, further comprising:
a fifth transistor connected between the driving voltage line and the first electrode of driving transistor; and
a sixth transistor connected between the first electrode of the driving transistor and the light emitting diode (LED).

* * * * *